US009553462B2

(12) United States Patent
Song et al.

(10) Patent No.: US 9,553,462 B2
(45) Date of Patent: Jan. 24, 2017

(54) VOLTAGE MEASURING APPARATUS AND BATTERY MANAGEMENT SYSTEM INCLUDING THE SAME

(71) Applicant: FAIRCHILD KOREA SEMICONDUCTOR LTD., Bucheon-si (KR)

(72) Inventors: Moonsik Song, Bucheon-si (KR); Seok Heo, Incheon (KR)

(73) Assignee: Fairchild Korea Semiconductor LTD (KR)

( * ) Notice: Subject to any disclaimer, the term of this patent is extended or adjusted under 35 U.S.C. 154(b) by 236 days.

(21) Appl. No.: 14/189,495

(22) Filed: Feb. 25, 2014

(65) Prior Publication Data

US 2014/0239897 A1 Aug. 28, 2014

(30) Foreign Application Priority Data

Feb. 25, 2013 (KR) ........................ 10-2013-0020099

(51) Int. Cl.
*H02J 7/00* (2006.01)
*G01R 31/36* (2006.01)

(52) U.S. Cl.
CPC ........... *H02J 7/0034* (2013.01); *G01R 31/362* (2013.01); *G01R 31/3658* (2013.01); *H02J 7/0021* (2013.01)

(58) Field of Classification Search
USPC ................ 320/116, 117, 118, 119, 134, 103, 121,320/132, 120, 128
See application file for complete search history.

(56) References Cited

U.S. PATENT DOCUMENTS 5,254,930 A * 10/1993 Daly ..................... H02J 7/0026 320/119
6,621,273 B2 * 9/2003 Takada .............. G01R 31/3658 320/166
7,459,887 B2 * 12/2008 Hatanaka ......... G01R 19/16571 320/162
7,656,164 B2 * 2/2010 Kawamura .......... G01R 31/362 320/116
7,679,369 B2 * 3/2010 Hartzog ............. G01R 19/0084 320/118
8,004,249 B2 * 8/2011 Lim ................... G01R 31/3658 320/116
8,901,891 B2 * 12/2014 Inoue ..................... G01R 19/14 320/132
2003/0044689 A1 * 3/2003 Miyazaki .............. H02J 7/0026 429/320
2006/0091857 A1 * 5/2006 Nakanishi ........... B60L 11/1851 320/116

(Continued)

*Primary Examiner* — Alexis A Boateng
(74) *Attorney, Agent, or Firm* — Grossman Tucker Perreault & Pfleger PLLC

(57) ABSTRACT

Disclosed are a voltage measuring apparatus and a battery management system including the same. The voltage measuring apparatus is connected to a plurality of battery cells connected to each other in series to measure respective voltage of the battery cells. The voltage measuring apparatus includes a first node coupled to one of an positive electrode and a negative electrode of one of a plurality of battery cells as a voltage measuring target, amplifies a voltage difference between the first node and the second node to generate an error voltage, converts the error voltage into a digital signal, and compensates for a polarity of the digital signal.

10 Claims, 5 Drawing Sheets

(56) References Cited

U.S. PATENT DOCUMENTS

| | | | | |
|---|---|---|---|---|
| 2009/0167244 | A1* | 7/2009 | Kurose ................. | H02J 7/0016<br>320/122 |
| 2011/0241622 | A1* | 10/2011 | Li ......................... | H01M 10/42<br>320/116 |
| 2012/0091966 | A1* | 4/2012 | Mori ..................... | H01M 10/44<br>320/134 |
| 2012/0161693 | A1* | 6/2012 | Nishizawa ......... | G01R 19/0084<br>320/103 |

* cited by examiner

FIG. 2

| VER | Dig [2:0] |
|---|---|
| +3V ~ +4V | 1 1 1 |
| +2V ~ +3V | 1 1 0 |
| +1V ~ +2V | 1 0 1 |
| +0V ~ +1V | 1 0 0 |
| -1V ~ -0V | 0 1 1 |
| -2V ~ -1V | 0 1 0 |
| -3V ~ -2V | 0 0 1 |
| -4V ~ -3V | 0 0 1 |

VOLTAGE MEASURING APPARATUS AND BATTERY MANAGEMENT SYSTEM INCLUDING THE SAME

CROSS-REFERENCE TO RELATED APPLICATION

This application claims priority to and the benefit of Korean Patent Application No. 10-2013-0020099 filed in the Korean Intellectual Property Office on Feb. 25, 2013, the entire contents of which are incorporated herein by reference.

BACKGROUND (a) Field

An exemplary embodiment relates to a voltage measuring apparatus and a battery management system including the same.

(b) Description of the Related Art

A voltage measuring apparatus according to the related art for measuring a plurality of battery cell voltages includes a switching unit for changing a polarity of a voltage received from a battery cell. The voltage measuring apparatus according to the related art includes a capacitor for storing voltages received from a plurality of battery cells.

When a plurality of battery cells are sequentially connected to the capacitor, a polarity of the voltage stored in the capacitor is alternately changed. The switching unit for changing the polarity of the voltage stored in the capacitor is sequentially and directly connected to the battery cells, respectively.

However, at least two of the battery cells have high voltages across the battery cell, respectively. As illustrated above, since the switching unit is directly connected to the battery cells, the switching unit must be configured by high voltage switching elements.

The high voltage switching elements have a larger size or a higher cost as compared with other type switching elements. Accordingly, the size and the cost of the voltage measuring apparatus are increased.

The above information disclosed in this Background section is only for enhancement of understanding of the background of the invention and therefore it may contain information that does not form the prior art that is already known in this country to a person of ordinary skill in the art.

SUMMARY

An exemplary embodiment provides a voltage measuring apparatus and a battery management system including the same having advantages of having no high voltage switching elements. An exemplary embodiment provides a voltage measuring apparatus capable of reducing a size and a cost and a battery management system including the same.

A voltage measuring apparatus according to an exemplary embodiment is connected to a plurality of battery cells connected to each other in series to measure respective voltage of the battery cells.

The voltage measuring apparatus includes a first multiplexer configured to couple one of an positive electrode of a negative electrode of a battery cell among the battery cells serving as a voltage measuring target to a first node; a second multiplexer configured to couple a remaining one of the positive electrode and the negative electrode of the battery cell serving as the voltage measuring target to a second node; a flying capacitor coupled between the first node and the second node; an error amplifier configured to couple amplify a voltage charged in the flying capacitor to generate an error voltage; an analog-to-digital converter configured to couple convert the error voltage into a digital signal; and a polarity correction unit configured to couple compensate a polarity of the digital signal.

The polarity correction unit may output the digital signal as it is when the error voltage is a positive voltage, and may invert the digital signal to output an inverted digital signal when the error voltage is a negative voltage.

The polarity correction unit may include an inverter configured to invert each bit of the digital signal to generate an inverted digital signal; and a polarity multiplexer configured to select one from the digital signal and the inverted digital signal according to a selection synchronous signal to output a correction digital signal.

The error amplifier may include a non-inverting terminal coupled to the first node; and an inverting terminal coupled to the second node. When an positive electrode of a first battery cell among battery cells is coupled to the first node, and a negative electrode of the first battery cell is coupled to the second node, the polarity multiplexer may output the digital signal as the correction digital signal according to the selection synchronous signal.

When an positive electrode of a first battery cell among battery cells is coupled to the first node, and a negative electrode of the first battery cell is coupled to the second node, the polarity multiplexer may output the inverting digital signal as the correction digital signal according to the selection synchronous signal.

The polarity correction unit may identify a polarity of the digital signal and outputs one of the digital signal and the inverted digital signal according to the identified polarity of the digital signal.

The voltage measuring apparatus may further include a relay configured to control connection between the first node and a first input terminal of the error amplifier and connection between the second node and a second input terminal of the error amplifier.

The relay may include a first switch coupled between the first node and the first input terminal of the error amplifier; and a second switch coupled between the second node and the second input of the error amplifier, wherein the flying capacitor is charged by the battery cell serving as the voltage measuring target, and then the first switch and the second switch are turned-on during a predetermined period.

A battery management system for managing a battery pack including a plurality of battery cells connected to each other in series according to an exemplary embodiment, the battery management system includes: a voltage measuring apparatus including a first node coupled to one of an positive electrode and a negative electrode of a battery cell among battery cells serving as a voltage measuring target and a second node coupled to a remaining one of the positive electrode and the negative electrode, and configured to amplify a voltage difference between the first node and the second node to generate an error voltage, to convert the error voltage to generate a digital signal, and to compensate a polarity of the digital signal; and a controller configured to receive a correction digital signal having a compensated polarity to control charge and discharge of the battery pack.

The voltage measuring apparatus of the battery management system may include a first multiplexer configured to couple the first node to one of an positive electrode and a negative electrode of the battery cell serving as the voltage measuring target; a second multiplexer configured to couple the second node to a remaining one of the positive electrode and the negative electrode of the battery cell serving as the voltage measuring target; a flying capacitor coupled between the first node and the second node; an error amplifier configured to amplify a voltage charged in the flying capacitor to generate the error voltage; an analog-to-digital converter configured to convert the error voltage into a digital signal; and a polarity correction unit configured to compensate a polarity of the digital signal.

The polarity correction unit may output the digital signal as it is when the error voltage is a positive voltage, and may invert the digital signal to output the inverted digital signal when the error voltage is a negative voltage.

The polarity correction unit may include: an inverter configured to invert each bit of the digital signal to generate an inverted digital signal; and a polarity multiplexer configured to select one from the digital signal and the inverted digital signal according to a selection synchronous signal to output a correction digital signal.

The error amplifier may include a non-inverting terminal coupled to the first node; and an inverting terminal coupled to the second node.

When an positive electrode of a first battery cell among battery cells is coupled to the first node, and a negative electrode of the first battery cell is coupled to the second node, the polarity multiplexer may output the digital signal as the correction digital signal according to the selection synchronous signal.

When an positive electrode of a first battery cell among battery cells is coupled to the first node, and a negative electrode of the first battery cell is coupled to the second node, the polarity multiplexer may output the inverting digital signal as the correction digital signal according to the selection synchronous signal.

The polarity correction unit may identify a polarity of the digital signal and outputs one of the digital signal and the inverted digital signal according to the identified polarity of the digital signal.

The voltage measuring apparatus may further include a relay configured to control connection between the first node and a first input terminal of the error amplifier and connection between the second node and a second input terminal of the error amplifier.

The relay may include a first switch coupled between the first node and the first input terminal of the error amplifier; and a second switch coupled between the second node and the second input of the error amplifier, wherein the flying capacitor is charged by the battery cell serving as the voltage measuring target, and then the first switch and the second switch are turned-on during a predetermined period.

An exemplary embodiment provides a voltage measuring apparatus having no high voltage switching elements and the battery management system including the same. Accordingly, the size and the size of the voltage measuring apparatus can be reduced, and the battery management system including the voltage measuring apparatus is provided.

BRIEF DESCRIPTION OF THE DRAWINGS

FIG. 2 is a table illustrating an example of converting an error voltage into a digital signal according to an exemplary embodiment.

DETAILED DESCRIPTION OF THE EMBODIMENTS

Figure 1:
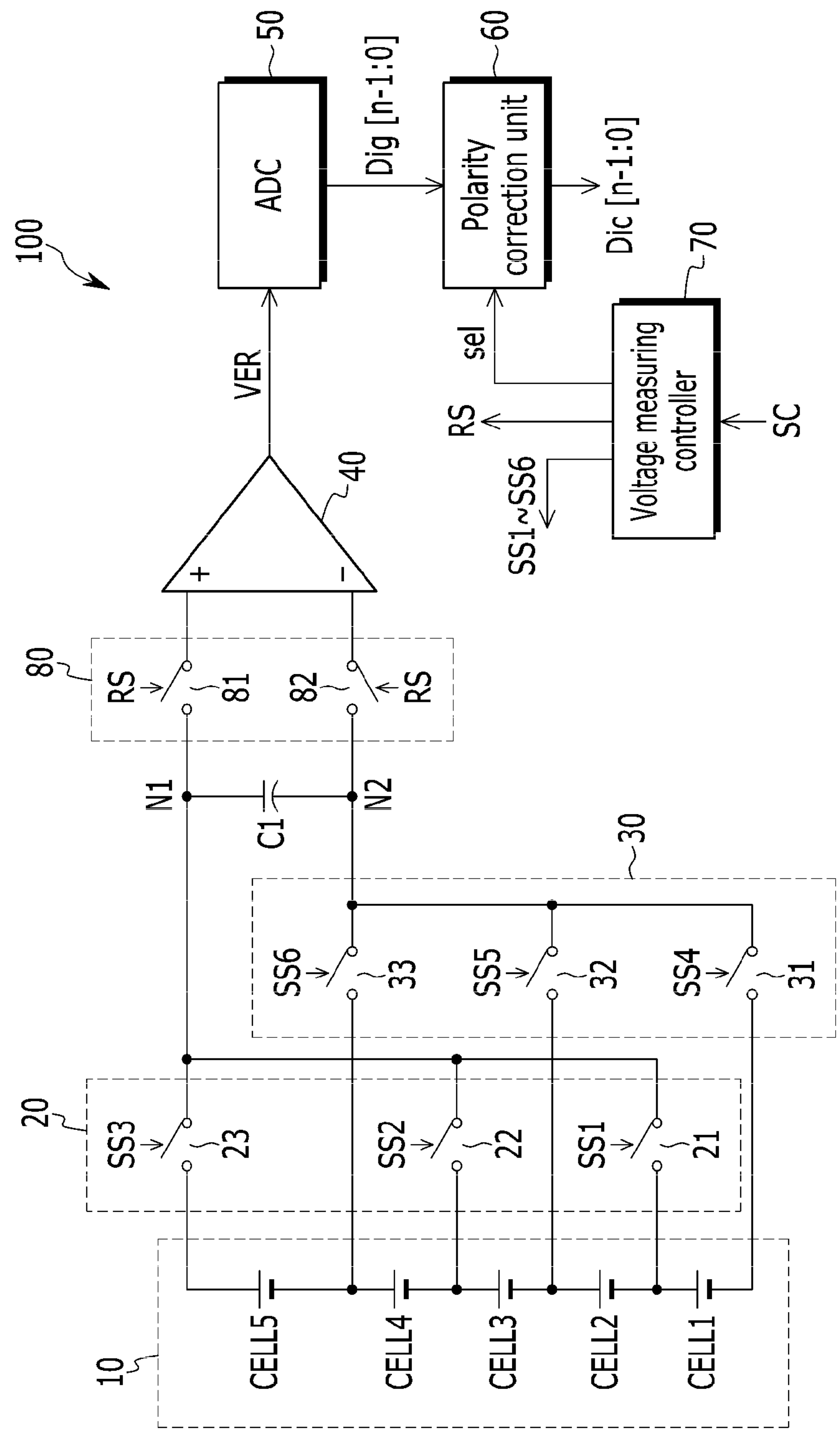
FIG. 1 is a circuit diagram illustrating a voltage measuring apparatus according to an exemplary embodiment.

In the following detailed description, only certain exemplary embodiments have been shown and described, simply by way of illustration. As those skilled in the art would realize, the described embodiments may be modified in various different ways, all without departing from the spirit or scope of the invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Hereinafter, a voltage measuring apparatus and a battery management system according to an exemplary embodiment will be described with reference to the accompanying drawings.

FIG. 1 is a circuit diagram illustrating a voltage measuring apparatus according to an exemplary embodiment.

As shown in FIG. 1, the voltage measuring apparatus 100 is connected to a battery pack 10 and measures cell voltages of a plurality of battery cells CELL1 to CELL5, respectively.

The voltage measuring apparatus 100 includes a first multiplexer 20, a second multiplexer 30, a flying capacitor C1, an error amplifier 40, an analog-digital converter (ADC) 50, a polarity correction unit 60, a voltage measuring controller 70, and a relay 80.

The first multiplexer 20 and the second multiplexer 30 connect a battery cell among battery cells CELL1 selected as a measuring target to CELL5 to the flying capacitor C1. For example, the first multiplexer 20 and the second multiplexer 30 may sequentially connect the battery cells CELL1 to CELL5 to the flying capacitor C1.

The first multiplexer 20 includes three switches 21 to 23 connected between an positive electrode or a negative electrode of a battery cell of the battery cells CELL1 to CELL5 selected as a voltage measuring target and a first node N1 which is one electrode of the flying capacitor C1.

A first switch 21 performs a switching operation according to a first multiplex control signal SS1, and includes one terminal connected to an positive electrode of a first battery cell CELL1 and another terminal connected to the first node N1.

A second switch 22 performs a switching operation according to a second multiplex control signal SS2, and includes one terminal connected to an positive electrode of a third battery cell CELL3 and a negative electrode of a fourth battery cell CELL4, and another terminal connected to the first node N1.

A third switch 23 performs a switching operation according to a third multiplex control signal SS3, and includes one terminal connected to an positive electrode of the fifth battery cell CELL5 and another terminal connected to the first node N1.

The second multiplexer 30 includes three switches 31 to 33 connected between an positive electrode or a negative electrode of a battery cell of the battery cells CELL1 to CELL5 selected as a voltage measuring target and a second node N2 which is another electrode of the flying capacitor C1.

A first switch 31 performs a switching operation according to a fourth multiplex control signal SS4, and includes one terminal connected to the negative electrode of the first battery cell CELL1 and another terminal connected to the second node N2.

A second switch 32 performs a switching operation according to a fifth multiplex control signal SS5, and includes one terminal connected to the negative electrode of the third battery cell CELL3 and the positive electrode of the second battery cell CELL2, and another terminal connected to the second node N2.

A third switch 33 performs a switching operation according to the fifth multiplex control signal SS5, and includes one terminal connected to an positive electrode of the fourth battery cell CELL4 and a negative electrode of the fifth battery cell CELL5, and another terminal connected to the second node N2.

For example, an enable level of each of the multiplex control signals SS1 to SS6 may be a high level, and a disable level thereof may be a low level.

When measuring a voltage of the first battery cell CELL1, the first and fourth control signals SS1 and SS4 are at the high level, the first switch 21 of the first multiplexer 20 and the first switch 31 of the second multiplexer 30 are turned-on. Accordingly, the positive electrode of the first battery cell CELL1 is connected to the first node N1, and the negative electrode of the first battery cell CELL1 is connected to the second node N2.

When measuring a voltage of the second battery cell CELL2, the first and fifth multiplex control signals SS1 and SS5 are at a high level, the first switch 21 of the first multiplexer 20 and the second switch 32 of the second multiplexer 30 are turned-on. Accordingly, the negative electrode of the second battery cell CELL2 is connected to the first node N1, and the positive electrode of the second battery cell CELL2 is connected to the second node N2.

When measuring a voltage of the third battery cell CELL3, the second and fifth multiplex control signals SS2 and SS5 are at a high level, the second switch 22 of the first multiplexer 20 and the second switch 32 of the second multiplexer 30 are turned-on. Accordingly, the positive electrode of the third battery cell CELL3 is connected to the first N1, and the negative electrode of the battery cell CELL3 is connected to the second node N2.

When measuring a voltage of the fourth battery cell CELL4, the second and sixth multiplex control signals SS2 and SS6 are at a high level, the second switch 22 of the first multiplexer 20 and the third switch 33 of the second multiplexer 30 are turned-on. Accordingly, the positive electrode of the fourth battery cell CELL4 is connected to the second node N2, and the negative electrode of the fourth battery cell CELL4 is connected to the first N1.

When measuring a voltage of the fifth battery cell CELL5, the third and sixth multiplex control signals SS3 and SS6 are at a high level, and the third switch 23 of the first multiplexer 20 and the third switch 33 of the second multiplexer 30 are turned-on. Accordingly, the positive electrode of the fifth battery cell CELL5 is connected to the first node N1, and the negative electrode of the fifth battery cell CELL5 is connected to the second node N2.

In this manner, respective positive electrodes of first, third, and fifth battery cells CELL1, CELL3, and CELL5 among the battery cells CELL1 to CELL5 are connected to the first node N1, and respective negative electrodes of the first, third, and fifth battery cells CELL1, CELL3, and CELL5 are connected to the second node N2. Respective positive electrodes of remaining battery cells CELL2 and CELL4 are connected to the second node N2, and respective negative electrodes of the remaining battery cells CELL2 and CELL4 are connected to the first node N1.

When measuring battery cell voltages of the battery cells CELL1, CELL3, and CELL5, a voltage supplied between the first node N1 and the second node N2 of the capacitor C1 has a positive a polarity. When measuring battery cell voltages of the battery cells CELL2 and CELL4, a voltage supplied between the first node N1 and the second node N2 has a negative polarity.

The relay 80 transfers an positive electrode voltage of the flying capacitor C1 to a next stage. In detail, after charging of the flying capacitor C1 is completed by a battery cell among the battery cells CELL1 to CELL5 selected as a measuring target, connection between a corresponding battery cell and the flying capacitor C1 is blocked. Next, the relay 80 is turned-on. While the relay 80 is turned-on, a voltage of the first node N1 is input to a non-inverting terminal (+) of the error amplifier 40, and a voltage of the second N2 is input to an inverting terminal (−) of the error amplifier 40.

The error amplifier 40 amplifies a voltage charged in the flying capacitor C1 to generate an error voltage. For example, the error amplifier 40 amplifies a difference between an input of the non-inverting terminal (+) connected to one of both terminals of the flying capacitor C1 and an input of the inverting terminal (−) connected to another terminal of the flying capacitor C1 to generate an error voltage VER. When the input of the non-inverting terminal (+) is greater than the input of the inverting terminal (−), the error voltage VER has a positive polarity. When the input of the non-inverting terminal (+) is less than the input of the inverting terminal (−), the error voltage VER has a negative polarity.

The ADC 50 converts the error voltage VER into a digital signal Dig[n−1:0] and outputs the digital signal. The digital signal Dig[n−1:0] according to the exemplary embodiment is an n bit signal, and the n value is determined according to a resolution.

FIG. 2 is a table illustrating an example of converting an error voltage into a digital signal according to an exemplary embodiment.

As shown in FIG. 2, when the error voltage VER being an analog voltage is converted as units of 1V, the error voltage is converted into a 3 bit digital signal.

For example, when the error voltage VER ranges from +3V to +4V, the ADC 50 converts the error voltage VER into a digital signal Dig[n−1:0] '111'. When the error voltage VER ranges from −3V to −2V, the ADC 50 converts the error voltage VER into a digital signal Dig[n−1:0] '001'.

In FIG. 2, the error voltage VER is converted into the digital signal Dig[n−1:0] as units of 1V, but the exemplary embodiment is not limited thereto. The smaller the unit of converting the error voltage VER into the digital signal Dig[n−1:0] is, the higher the bit number of the digital signal Dig[n−1:0] is increased.

For example, when a conversion unit is 0.5V in a condition that the error voltage VER ranges from −4 to +4V according to a voltage of the battery cell, the error voltage (VER) is divided into 16 ($2^4$) regions. In this case, the digital signal Dig[n−1:0] becomes a 4 bit digital signal. When the conversion unit is 0.25V in the same condition, the error voltage VER is divided into 32 ($2^5$) regions. In this case, the digital signal (Dig[n−1:0]) becomes a 5 bit signal.

The polarity correcting unit 60 compensates for a polarity of the digital signal Dig[n−1:0] as a positive polarity. For example, the polarity correction unit 60 outputs one of a digital signal Dig[n−1:0] and an inverted digital signal Digb[n−1:0] which is an inverted signal of the digital signal Dig[n−1:0] according to whether the error voltage VER is a positive voltage (positive polarity) or a negative voltage (negative polarity). The digital signal output from the polarity correction unit 60 refers to a correction digital signal Dic[n−1:0].

For example, when the error voltage VER has a negative polarity, the polarity correction unit 60 outputs the inverted digital signal Dig[n−1:0] as the correction digital signal Dic[n−1:0]. On the contrary, when the error voltage VER has a positive polarity, the polarity correction unit 60 outputs the digital signal Dig[n−1:0] as the correction digital signal Dic[n−1:0].

Figure 3:
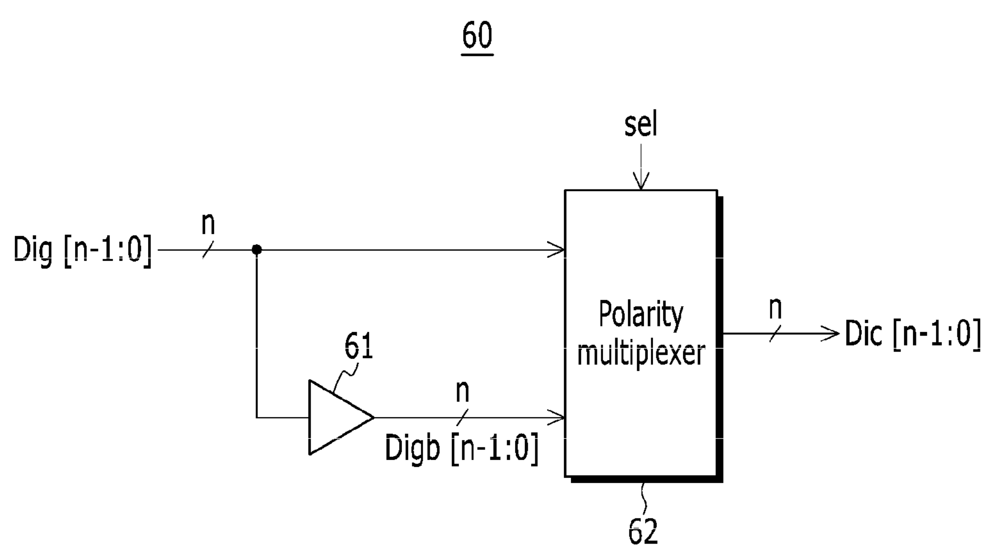
FIG. 3 is a diagram illustrating a polarity correction unit according to an exemplary embodiment.

Referring to FIG. 3, an example of the polarity correction unit 60 is described.

FIG. 3 is a diagram illustrating a polarity correction unit according to an exemplary embodiment.

As shown in FIG. 3, the polarity correction unit 60 includes an inverter 61 and a polarity multiplexer 62.

The inverter 61 receives a digital signal Dig[n−1:0] and inverts each bit of the digital signal Dig[n−1:0] to generate an inverted digital signal Digb[n−1:0].

The polarity multiplexer 62 selects one from the digital signal Dig[n−1:0] and the inverted digital signal Digb[n−1:0] according to a selection synchronous signal sel to output the correction digital signal Dic[n−1:0]. The selection synchronous signal sel is a signal indicating whether the digital signal Dig[n−1:0] has a positive polarity or a negative polarity, and is generated in synchronization with a voltage measuring control signal SC.

For example, in order to measure a voltage of the first battery cell CELL1, when the first multiplex control signal SS1 and the fourth multiplex control signal SS4 are at an enable level, an positive electrode of the first battery cell CELL1 is connected to the first N1, and a negative electrode of the first battery cell CELL1 is connected to the second node N2. In this case, the digital signal Dig[n−1:0] has a positive polarity, and the selection synchronous signal sel is at a level of instructing the polarity multiplexer 62 to output the digital signal Dig[n−1:0] (e.g., high level).

In order to measure a voltage of the second battery cell CELL2, when the first multiplex control signal SS1 and the fifth multiplex control signal SS5 are at an enable level, the positive electrode of the second battery cell CELL2 is connected to the second node N2, and the negative electrode of the second battery cell CELL2 is connected to the first node N1. In this case, the digital signal Dig[n−1:0] has a negative polarity, and the selection synchronous signal sel is at a level instructing the polarity multiplexer 62 to output an inverted digital signal Digb[n−1:0] (e.g., low level).

In addition, the polarity multiplexer 62 may identifies a polarity of the digital signal Dig[n−1:0], and may output one of the digital signal Dig[n−1:0] and the inverted digital signal Digb[n−1:0] as a correction digital signal Dic[n−1:0] according to the identified polarity of the digital signal Dig[n−1:0].

For example, as shown in FIG. 2, the digital signal Dig[n−1:0] when the error voltage VER has a positive polarity is different from that when the error voltage VER has a negative polarity. When receiving the digital signal Dig[n−1:0] and the digital signal Dig[n−1:0] corresponds to a negative error voltage VER, the polarity multiplexer 62 outputs the inverted digital signal Digb[n−1:0] as the correction digital signal Dic[n−1:0]. When receiving the digital signal Dig[n−1:0] and the digital signal Dig[n−1:0] corresponds to a positive error voltage VER, the polarity multiplexer 62 outputs the digital signal Dig[n−1:0] as the correction digital signal Dic[n−1:0].

The voltage measuring controller 70 generates a plurality of multiplex control signals SS1 to SS6 according to the voltage measuring control signal SC. When the polarity correction unit 160 operates according to the selection synchronous signal sel, the voltage measuring controller 70 may further generate the selection synchronous signal sel according to the voltage measuring control signal SC.

The voltage measuring control signal SC may be a clock signal for determining a measuring period of a battery cell voltage. When the voltage measuring control signal SC is triggered, the voltage measuring controller 70 may generate a plurality of multiplex control signals SS1 to SS6 for sequentially measuring a plurality of battery cells CELL1 to CELL5.

The voltage measuring controller 70 may generate a relay control signal RS for transferring a voltage charged in the flying capacitor C1 to the error amplifier 40. For example, the voltage measuring controller 70 may be synchronized when a predetermined first period is delayed after the voltage measuring control signal SC is triggered having an enable level during a predetermined period to generate the relay control signal RS having an enable level during a predetermined period.

Further, the voltage measuring controller 70 may be synchronized at a measuring period of a battery cell voltage to generate the selection synchronous signal sel. For example, the voltage measuring controller 70 may generate the selection synchronous signal sel the level of which is inverted when a predetermined second period elapses after the voltage measuring control signal SC is triggered. In this case, a period of the selection synchronous signal sel may be twice greater than a period of the voltage measuring control signal SC.

The relay 80 controls connection between the flying capacitor C1 and the error amplifier 40. The relay 80 includes a first switch 81 connected to the first node N1 and a non-inverting terminal (+) of the error amplifier 40 and a second switch 82 connected between the second node N2 and an inverting terminal (−) of the error amplifier 40.

The first switch 81 and the second switch 82 perform a switching operation according to a relay control signal RS. For example, the first and second switches 81 and 82 are turned-on according to a relay control signal RS at a high level, and the first and second switches 81 and 82 are turned-on according to a relay control signal RS at a low level.

Figure 4:
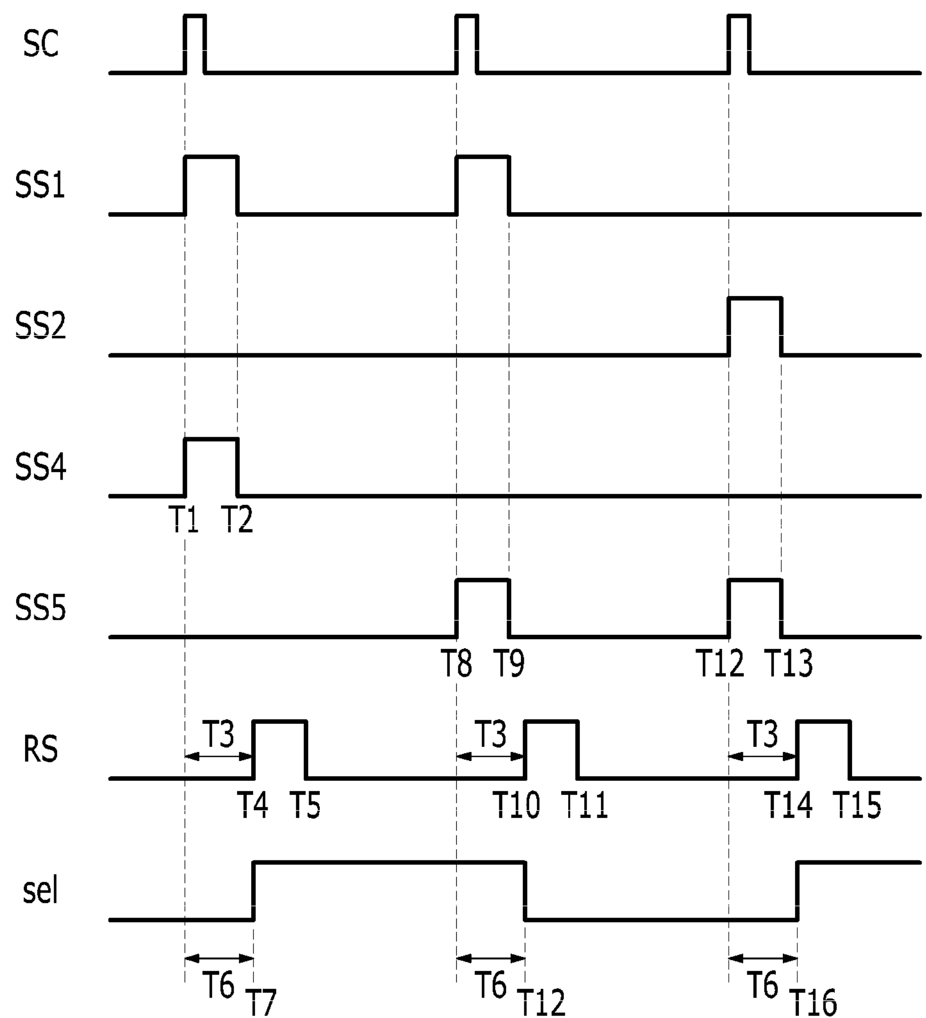
FIG. 4 is a diagram illustrating a voltage measuring control signal, a multiplex control signal, a relay control signal, and a selection synchronous signal according to an exemplary embodiment.

FIG. 4 is a diagram illustrating a voltage measuring control signal, a multiplex control signal, a relay control signal, and a selection synchronous signal according to an exemplary embodiment.

As shown in FIG. 4, a voltage measuring control signal SC is triggered at a time point T1. Then, the voltage measuring controller 70 generates a first multiplex control signal SS1 and a fourth multiplex control signal SS4 at high level during a period T1~T2 in order to measure a voltage of the first battery cell CELL1.

The voltage measuring controller 70 generates a relay control signal RS at a high level at a time point T4 when a first period is delayed from a trigger time point T1.

Accordingly, the flying capacitor C1 is charged by the first battery cell CELL1 during a period T1~T2. After the time point T2, connection between the first battery cell CELL1 and the flying capacitor C1 is blocked. The control signal RS rises a high level at a time point T4, and remains at the high level during a period T4~T5 so that each of voltages of both terminal of the flying capacitor C1 (voltage of the first node N1 and voltage of the second N2) is transferred to the non-inverting terminal (+) and the inverting terminal (−) of the error amplifier 40.

The error amplifier 40 amplifies a difference between a voltage at the first node N1 and a voltage at the second N2 received through the relay 80 to generate an error voltage VER corresponding to a voltage of the first battery cell CELL1.

The voltage measuring controller 70 inverts a level of the selection synchronous signal sel at a time point T7 when a second period T6 is delayed from a trigger time point T1. As shown in FIG. 4, the selection synchronous signal sel transitions from a low level to a high level at a time point T7.

When the selection synchronous signal sel is at a high level, the polarity correction unit 60 outputs the digital signal Dig[n−1:0] as a correction digital signal Dic[n−1:0].

Next, the voltage measuring control signal SC is triggered at a time point T8. Accordingly, the voltage measuring controller 70 generates the first multiplex control signal SS1 and the fifth multiplex control signal SS5 at a high level during a period T8~T9 in order to measure a voltage of the second battery cell CELL2.

The voltage measuring controller 70 generates a relay control signal RS at a high level at a time point T10 when a first period T3 is delayed from the first period T8.

Accordingly, the capacitor C1 is charged by the second battery cell CELL2 during a period T8~T9. After the time point T9, connection between the second battery cell CELL2 and the flying capacitor C1 is blocked. The relay control signal RS becomes a high level during a period T10~T11 so that a voltage across the capacitor C1 (voltage of the first node N1 and voltage of the second node N2) is transferred to the non-inverting terminal (+) and the inverting terminal (−) of the error amplifier 40.

The error amplifier 40 amplifies a difference between the voltage at the first N1 and the voltage at the second node N2 received through the relay 80 to generate an error voltage VER corresponding to the voltage of the second battery cell CELL2.

The voltage measuring controller 70 inverts a level of the selection synchronous signal sel at a time point T12 when the second period T6 is delayed from a time point T8. As shown in FIG. 4, the selection synchronous signal sel transitions from the high level to the low level at the time point T12.

When the selection synchronous signal sel is at the low level, the polarity correction unit 60 outputs the inverted digital signal Digb[n−1:0] as the correction digital signal Dic[n−1:0].

Next, the voltage measuring control signal SC is triggered at the time point T12. Accordingly, the voltage measuring controller 70 generates the second multiplex control signal SS2 and the fifth multiplex control signal SS5 at the high level during a period T12~T13 in order to measure the voltage of the third battery cell CELL3.

The voltage measuring controller 70 generates the relay control signal RS at the high level at a time point T14 when the first period T3 is delayed from the trigger time point T12.

Accordingly, the flying capacitor C1 is charged by the third battery cell CELL3 during a period T12~T13. After the time point T13, connection between the first battery cell CELL1 and the flying capacitor C1 is blocked, the relay control signal RS transitions to the high level at the time point T14 and maintains the high level during the period T14~T15, a voltage across the flying capacitor C1 (voltage of the first node N1 and voltage of the second node N2) is transferred to the non-inverting terminal (+) and the inverting terminal (−) of the error amplifier 40.

The error amplifier 40 amplifies a difference between the voltage of the first node N1 and the voltage of the second node N2 received through the relay 80 to generate an error voltage VER corresponding to the voltage of the third battery cell CELL3.

The voltage measuring controller 70 inverts a level of the selection synchronous signal sel at a time point T16 when the second period T6 is delayed from the trigger time point T12. As shown in FIG. 4, the selection synchronous signal sel transitions from the low level to the high level at the time point T16. When the selection synchronous signal sel is at the high level, the polarity correction unit 60 outputs the digital signal Dig[n−1:0] as the correction digital signal Dic[n−1:0].

Voltages of the battery cells CELL1 to CELL5 may be measured by repeating the operation in this manner, respectively.

Hereinafter, referring to FIG. 5, a battery management system according to an exemplary embodiment will be described.

Figure 5:
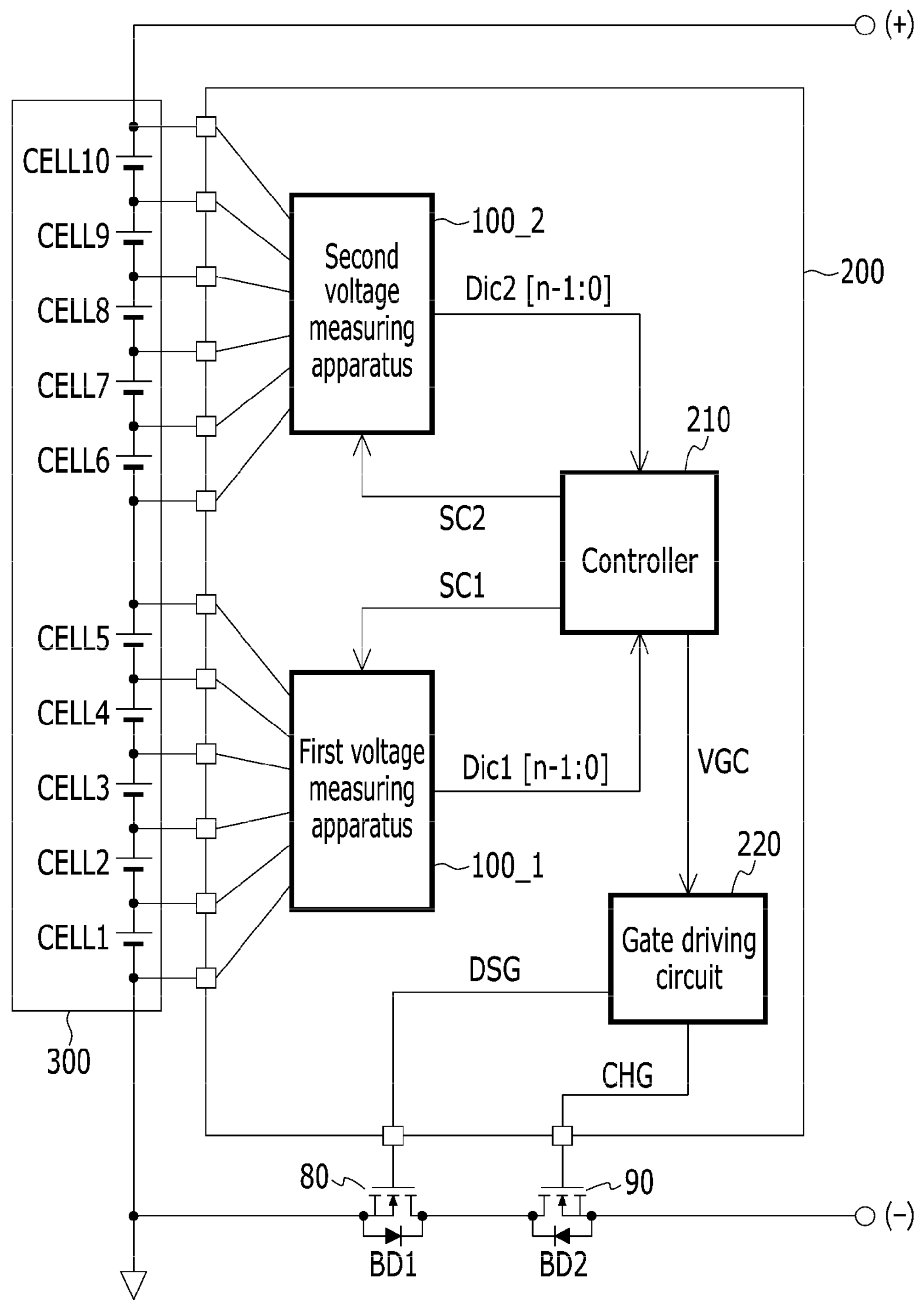
FIG. 5 is a diagram illustrating a battery management system including a voltage measuring apparatus according to an exemplary embodiment.

FIG. 5 is a diagram illustrating a battery management system including a voltage measuring apparatus according to an exemplary embodiment.

As shown in FIG. 5, the battery management system 200 is connected to ten battery cells CELL1 to CELL10. In FIG. 5, a battery pack 300 includes ten battery cells, but the number of battery cells is illustrative purpose only and an exemplary embodiment not limited thereto.

One terminal of the battery 300 is connected to an positive electrode (+), and another terminal of the battery pack 300 is connected to a ground and a negative electrode (−). A discharge switch 80 and a charge switch 90 are serially connected between the ground and the negative electrode (−). The discharge switch 80 performs a switching operation according to a discharge control signal DSG, and the charge switch 90 performs a switching operation according to a charge control signal CHG. A first body diode BD1 is provided between a drain and a source of the discharge switch 80, and a second body diode BD2 is provided between a drain and a source of the charge switch 90.

A charger (not shown) or a load (not shown) may be connected between an positive electrode (+) and a negative electrode (−).

The battery management system 200 includes a first voltage measuring apparatus 100_1 and a second voltage measuring apparatus 100_2 which measure cell voltages of the battery cells CELL1 to CELL5. However, an embodiment illustrated in FIG. 3 is an example of describing the exemplary embodiment, but the exemplary embodiment is not limited thereto.

For example, one voltage measuring apparatus may be designed to measure ten battery cells. That is, it is sufficient if each of the first multiplexer 20 and the second multiplexer 30 in FIG. 1 includes eleven switches.

As shown in FIG. 5, first to fifth battery cells CELL1 to CELL5 are connected to the first voltage measuring apparatus 100_1, and the sixth to tenth battery cell CELL6 to CELL10 are connected to the second voltage measuring apparatus 100_2.

First, a controller 210 being one constituent element of the battery management system 200 generates and transfers voltage measuring control signals SC1 and SC2 to the first voltage measuring apparatus 100_1 and the second voltage measuring apparatus 100_2.

The first voltage measuring apparatus 100_1 measures respective voltages of a plurality of battery cells CELL1 to CELL5 according to the first voltage measuring control signal SC1 to generate a first correction digital signal Dic[n−1:0]. The first correction digital signal Dic[n−1:0] is transmitted to the controller 210.

The second voltage measuring apparatus 100_2 measures respective voltages of a plurality of battery cell (CELL6-CELL10) according to the second voltage measuring control signal SC2 to generate the second correction digital signal Dic[n−1:0]. The second correction digital signal Dic[n−1:0] is transmitted to controller 210.

Configurations and operations of the first voltage measuring apparatus 100_1 and the second voltage measuring apparatus 100_2 are the same as those illustrated with reference to FIGS. 1 to 4, and thus a detailed description thereof is omitted.

The controller 210 detects states of the battery cells CELL1 to CELL10 according to the first and the second correction digital signals Dic[n−1:0] to control charge and discharge operations. For example, the controller 210 generates a gate control signal VGC for controlling the charge and discharge operations.

A gate driving circuit 220 being one constituent element of the battery management system 200 generates a discharge control signal DSG and a charge control signal CHG according to the gate control signal VGC.

In this manner, the voltage measuring apparatus and the battery management system including the same according to an exemplary embodiment may measure voltages of battery cells without using a high voltage switch to control charge and discharge of the battery pack.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS voltage measuring apparatus 100
first multiplexer 20
second multiplexer 30
flying capacitor C1
error amplifier 40
analog-digital converter 50
polarity correction unit 60
voltage measuring controller 70
inverter 61
polarity multiplexer 62
relay 80
switch 21 to 23, 31 to 33
battery management system 200
controller 210
gate driving circuit 220
discharge switch 80
charge switch 90

What is claimed is:

1. A battery management system for managing a battery pack including a plurality of battery cells coupled to each other in series, the battery management system comprising:

a voltage measuring apparatus including a first node coupled to one of a positive electrode and a negative electrode of a battery cell among battery cells serving as a voltage measuring target and a second node coupled to a remaining one of the positive electrode and the negative electrode, and configured to amplify a voltage difference between the first node and the second node to generate an error voltage, to convert the error voltage to generate a digital signal, and to compensate a polarity of the digital signal; and a controller configured to receive a correction digital signal having a compensated polarity to control charge and discharge of the battery pack.

2. The battery management system of claim 1, wherein the voltage measuring apparatus comprises:

a first multiplexer configured to couple the first node to one of a positive electrode and a negative electrode of the battery cell serving as the voltage measuring target;

a second multiplexer configured to couple the second node to a remaining one of the positive electrode and the negative electrode of the battery cell serving as the voltage measuring target;

a flying capacitor coupled between the first node and the second node;

an error amplifier configured to amplify a voltage charged in the flying capacitor to generate the error voltage;

an analog-to-digital converter configured to convert the error voltage into a digital signal; and a polarity correction unit configured to compensate a polarity of the digital signal.

3. The battery management system of claim 2, wherein the polarity correction unit is configured to output the digital signal as it is when the error voltage is a positive voltage and to invert the digital signal to output the inverted digital signal when the error voltage is a negative voltage.

4. The battery management system of claim 3, wherein the polarity correction unit comprises:

an inverter configured to invert each bit of the digital signal to generate an inverted digital signal; and a polarity multiplexer configured to select one from the digital signal and the inverted digital signal according to a selection synchronous signal to output a correction digital signal.

5. The battery management system of claim 4, wherein the error amplifier comprises:

a non-inverting terminal coupled to the first node; and an inverting terminal coupled to the second node.

6. The battery management system of claim 5, wherein:

when a positive electrode of a first battery cell among battery cells is coupled to the first node, and a negative electrode of the first battery cell is coupled to the second node, the polarity multiplexer is configured to output the digital signal as the correction digital signal according to the selection synchronous signal.

7. The battery management system of claim 5, wherein:

when a negative electrode of a first battery cell among battery cells is coupled to the first node, and a positive electrode of the first battery cell is coupled to the second node, the polarity multiplexer is configured to output the inverting digital signal as the correction digital signal according to the selection synchronous signal.

8. The battery management system of claim 3, wherein:

the polarity correction unit is configured to identify a polarity of the digital signal and to output one of the digital signal and the inverted digital signal according to the identified polarity of the digital signal.

9. The battery management system of claim 2, wherein the voltage measuring apparatus, further comprises a relay configured to control connection between the first node and a first input terminal of the error amplifier and connection between the second node and a second input terminal of the error amplifier.

10. The battery management system of claim 9, wherein the relay comprises:

a first switch coupled between the first node and the first input terminal of the error amplifier; and a second switch coupled between the second node and the second input of the error amplifier, and wherein the flying capacitor is charged by the battery cell serving as the voltage measuring target, and then the first switch and the second switch are turned-on during a predetermined period.

* * * * *